United States Patent [19]
Takahama et al.

[11] Patent Number: 5,271,993
[45] Date of Patent: Dec. 21, 1993

[54] METHOD OF MANUFACTURING INSULATION SUBSTRATE FOR SEMICONDUCTOR DEVICE AND METAL PATTERN PLATE USED THEREFOR

[75] Inventors: Shinobu Takahama; Kunitaka Kamishima, both of Fukuoka, Japan

[73] Assignee: Mitsubishi Denki Kabushiki Kaisha, Tokyo, Japan

[21] Appl. No.: 734,775

[22] Filed: Jul. 23, 1991

[30] Foreign Application Priority Data

Aug. 3, 1990 [JP] Japan .................. 2-207271

[51] Int. Cl.⁵ .................................... B32B 9/00
[52] U.S. Cl. ............................. 428/209; 428/901
[58] Field of Search ......................... 428/209, 901

[56] References Cited

U.S. PATENT DOCUMENTS

| | | | |
|---|---|---|---|
| 3,508,984 | 4/1970 | Travis | 156/3 |
| 4,985,294 | 1/1991 | Watanabe et al. | 428/209 |
| 5,039,570 | 8/1991 | Sturm | 428/209 |

FOREIGN PATENT DOCUMENTS 0159208 10/1985 European Pat. Off. .
0264780 4/1988 European Pat. Off. .
0366338 5/1990 European Pat. Off. .

OTHER PUBLICATIONS

Third IEEE/CHMT International Electronic Manufacturing Technology Symposim, Oct. 12–14, 1987, pp. 2–9, Norio Miura, "Circuit Assembly Innovation by Insulated Metal Substrate Technology".

*Primary Examiner*—Patrick J. Ryan
*Assistant Examiner*—Cathy K. Lee
*Attorney, Agent, or Firm*—Oblon, Spivak, McClelland, Maier & Neustadt

[57] ABSTRACT

In manufacturing an insulation substrate used in a semiconductor device, a metal plate (10) having relatively thick body portions (11a, 11b, 11c) and relatively thin linkage portions (12,13) is prepared. The body portions are spaced from each other and the linkage portions link up the respective body portions. The metal plate is fixed to a metal flat plate (1) through a resin layer (2). The linkage portions are then removed through selective etching. The structure thus obtained is cut into a plurality of unit structures, to thereby obtain an in insulation substrate having conductive circuit patterns thereon.

20 Claims, 11 Drawing Sheets

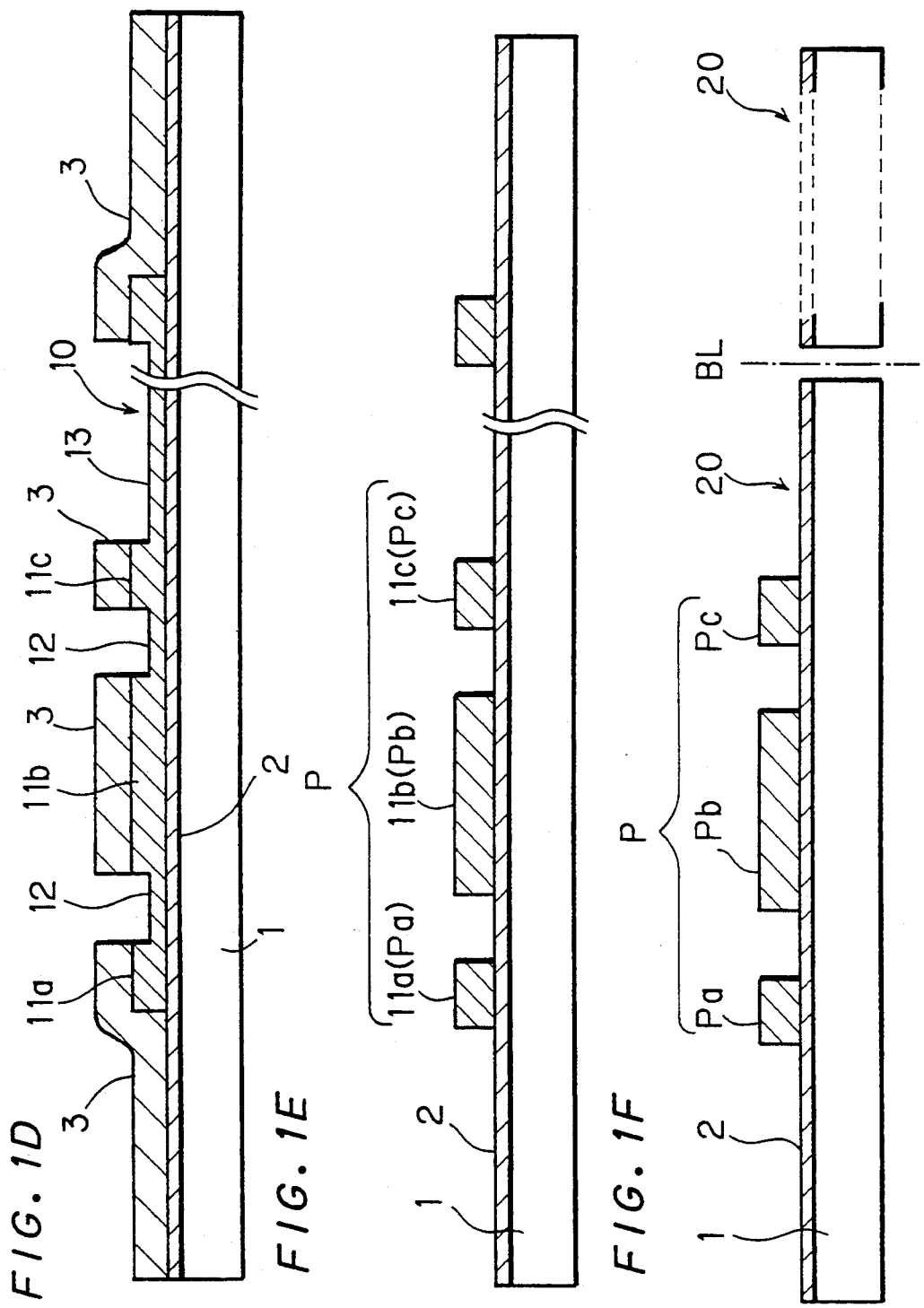

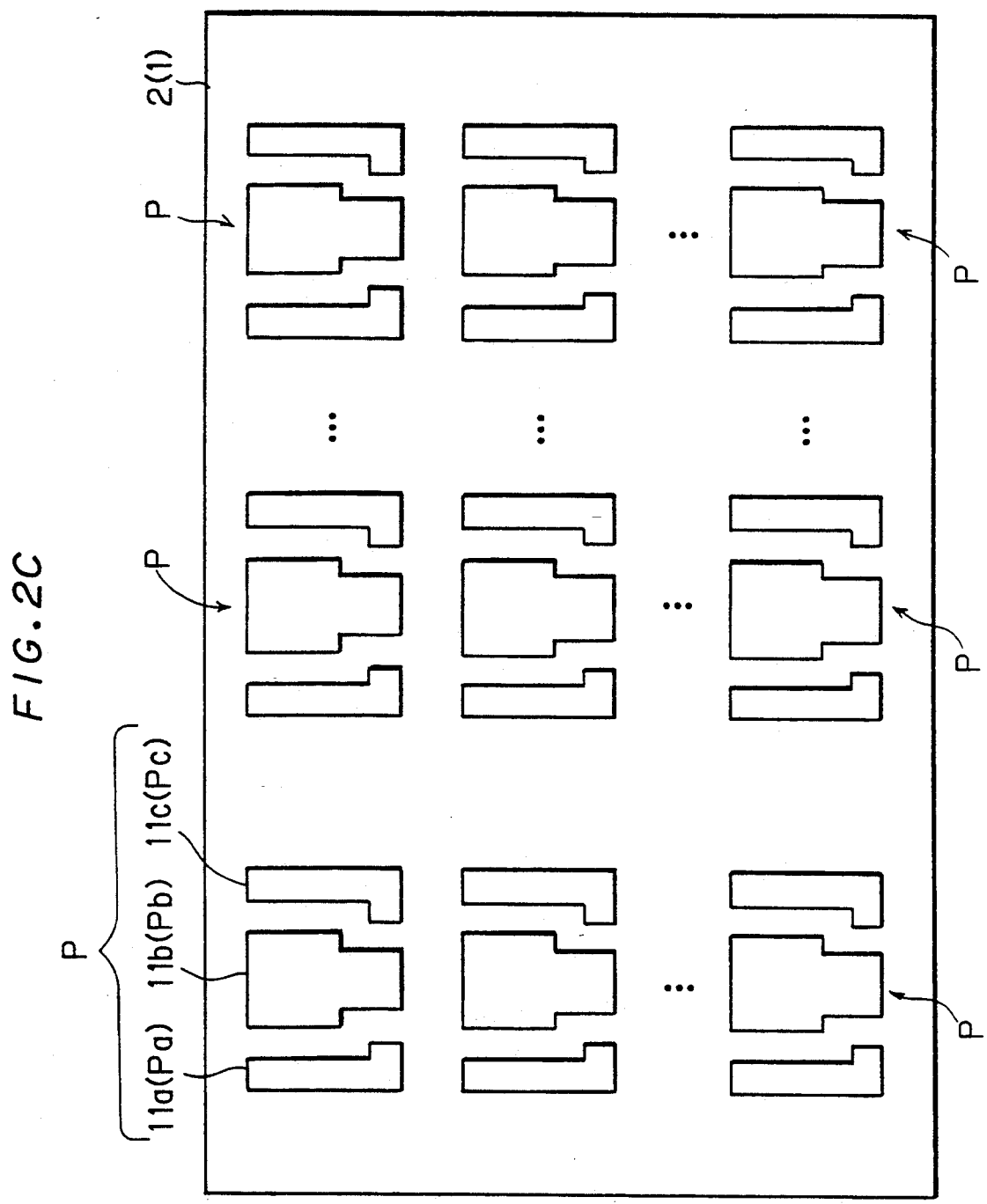

METHOD OF MANUFACTURING INSULATION SUBSTRATE FOR SEMICONDUCTOR DEVICE AND METAL PATTERN PLATE USED THEREFOR

BACKGROUND OF THE INVENTION

1. Field of the Invention

The present invention relates to a method of manufacturing an insulation substrate for a semiconductor device and a novel metal member used in the manufacturing process.

2. Description of the Prior Art

In a power semiconductor device, a semiconductor chip or element must be fixed therein and electronic connection related to the semiconductor element must be attained. Thus, the device is often provided with an insulation substrate which includes a conductive circuit pattern and an insulation film. FIG. 9A is a plane view of such an insulation substrate of a conventional design. FIG. 9B is a cross sectional view of the same taken along lines IX—IX of FIG. 9A. An insulation substrate 100 includes a metal plate 101 and an insulation film 102 formed thereon. A metal circuit pattern 103 is fixed on the insulation film 102. The circuit pattern 103 consists of three portions 103a, 103b and 103c. On the portion 103b disposed in the center of the three, a semiconductor chip 104 is mounted. The portions 103a and 103c, disposed on the both sides of the portion 103b, are electrically connected to the semiconductor chip 104 by an aluminum wire 105.

The metal plate 101 functions as a heat sink for radiating heat which is generated when the semiconductor chip 104 operates, the thickness of the metal plate 101 being about 1 to 3 mm. The insulation film 102 electrically insulates the circuit pattern 103 and the metal plate 101, and the thickness thereof is about 0.05 to 0.2 mm. The circuit pattern 103 has a thickness of about 0.03 to 0.3 mm. Through an external terminal erected on the circuit pattern 103 in an edge area 103e thereof, the semiconductor chip 104 and external circuits are electrically connected. The insulation plate 100 is provided with bolt holes 106 through which the semiconductor device is bolted to a desired apparatus.

Recent years have seen a growing demand for a small sized power device which controls large electric power. However, the conventional insulation substrate 100 does not fulfill the demand, since the vertical sectional area of the circuit pattern 103 is not so large, when a large current flows in the semiconductor chip 104, the circuit pattern 103 allows only insufficient horizontal thermal diffusion. In addition, within the pattern circuit 103 itself, increased voltage drop and heat radiation can result. As this result, a semiconductor device comprising the insulation substrate 100 can not withstand large electric power.

One of the methods for increasing the vertical sectional area of the circuit pattern 103 is to enlarge the plane area of the circuit pattern 103. However, this method increases an overall plane area of the insulation substrate 100 accordingly, and is thus, in direct contradiction to the demand for small size and duration to large electric power. It is therefore understood that the circuit pattern 103 must be thickened to increase the vertical sectional area thereof without increasing the size of the device.

As a method for obtaining a thick circuit pattern, two methods are considered. The first method is conducted through selective etching of a uniform and relatively thick metal plate affixed to the insulation film 102. In the second method, parts to form the circuit pattern are manufactured, as discrete components, from a uniform and relatively thick metal plate by punching. Thereafter, thus manufactured parts are arranged and affixed on the insulation film 102.

The first method causes a problem that etching a thick metal plate leads to a low size accuracy. The second method is not problem-free, either. Although parts for the circuit pattern can be sized with a high accuracy, the number of components to be produced separately is increased. In addition, the second method requires means for positioning the parts of the circuit pattern on the insulation film 102. Thus, manufacturing costs would swell up.

SUMMARY OF THE INVENTION

The present invention is directed to a method of manufacturing an insulation substrate used in a semiconductor device.

The insulation substrate comprises a metal plate, an insulation layer provided on the metal plate and a conductive circuit pattern formed on the insulation layer.

According to the present invention, prepared is a metal pattern plate comprising a plurality of body portions and linkage portions. The plurality of body portions have a first thickness and have shapes corresponding to respective portions of the circuit pattern. On the other hand, the linkage portions have a second thickness and link the plurality of body portions to each other. The second thickness is smaller than the first thickness.

Then, the insulation layer is formed on the metal plate, and fixing the metal pattern plate is fixed onto the insulation layer. The linkage portions are then removed from the metal pattern plate on the insulation layer to thereby obtain the insulation substrate.

According to the present invention, spacings between respective body portions are previously defined in high accuracy on the metal pattern plate, and therefore, it is not necessary to conduct positioning of the body members after fixed on the insulation layer. Since the linkage portions are relatively thin, the removal thereof is easy and the accuracy in the configuration of the circuit pattern is not decreased.

In an aspect of the present invention, the metal pattern plate has a plurality of unit pattern parts each comprising the plurality of body portions and the linkage portions. Respective unit portions are linked to each other through other linkage portions having a third thickness smaller than the first thickness. After fixing the metal pattern plate onto the insulation layer, all of the linkage portions are removed and the structure thus obtained is divided into a plurality of unit structures corresponding to the insulation substrates.

Through this process, the plurality of insulation substrates can be simultaneously obtained.

The present invention is also directed to a metal pattern plate used in manufacturing the insulation substrate.

According to the present invention, the metal pattern plate comprises: (a) a plurality of body portions having a first thickness and having shapes corresponding to respective portions of the circuit pattern; and (b) linkage portions having a second thickness and linking the plurality of body portions to each other. The second thickness is smaller than the first thickness;

In the present invention, the term "metal" encompasses simple metal, alloy and layered metal.

Accordingly, an object of the present invention is to obtain an insulation substrate with a thick circuit pattern while attaining a high size accuracy and a low manufacturing cost.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A to 1F are cross sectional views showing a process of manufacturing an insulation substrate according to a preferred embodiment of the present invention;

FIGS. 2A to 2D are plane views illustrating a metal pattern plate and a manufacturing process using the same according to the preferred embodiment of the present invention;

DESCRIPTION OF THE PREFERRED EMBODIMENTS

Figure 1A:
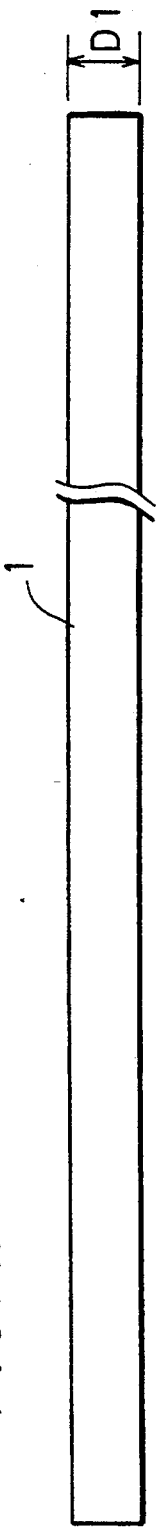

FIGS. 1A to 1F are cross sectional views showing a process of manufacturing an insulation substrate according to a preferred embodiment of the present invention. According to the preferred embodiment, a plurality of insulation substrates can be manufactured at one time. First, a flat metal plate I is prepared whose thickness D1 is about 1 to 3 mm (FIG. 1A). The metal plate 1 is an aluminum plate, for example. The metal plate 1 has a plane area size equal to or larger than twice the plane area size of each insulation substrate to be manufactured. This condition must be met because a plurality of insulation substrates will be obtained later at one time through cutting process. For instance, the plane area size of the metal plate 1 is 250 mm × 500 mm if twenty five insulation substrates each having the plane area size of 50 mm × 100 mm are required.

Figure 1B:
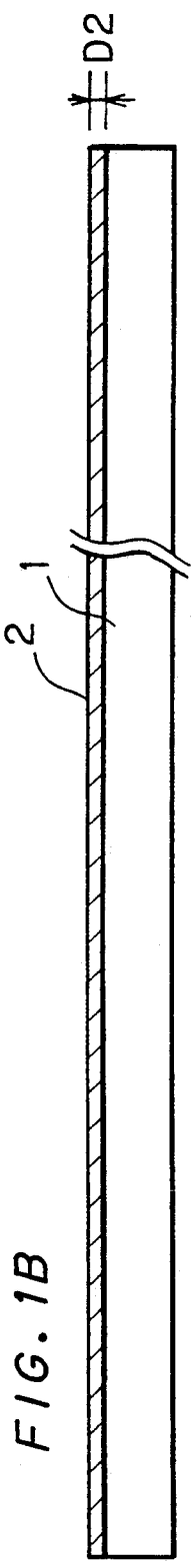
Figure 1C:
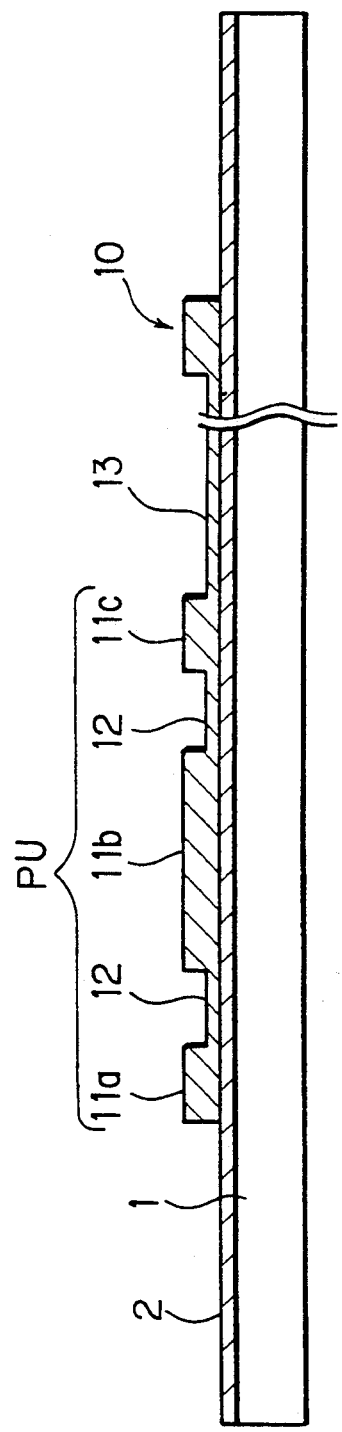

Next, the upper surface of the metal plate 1 is entirely coated with epoxy resin, whereby an insulation film 2 with the thickness D2 of about 0.05 to 0.2 mm is formed (FIG. 1B). Before the epoxy resin hardens, a metal pattern plate 10 is disposed on the insulation film 2 while attaining positional alignment therebetween (FIG. 1C). The metal pattern plate 10 is a copper plate and is in a configuration described later. The metal pattern plate 10 is fixed to the insulation film 2 by hardened epoxy resin. Thus, the epoxy resin forming the insulation film 2 has two functions, one as an electrical insulator and the another as an adhesive.

Figure 2A:
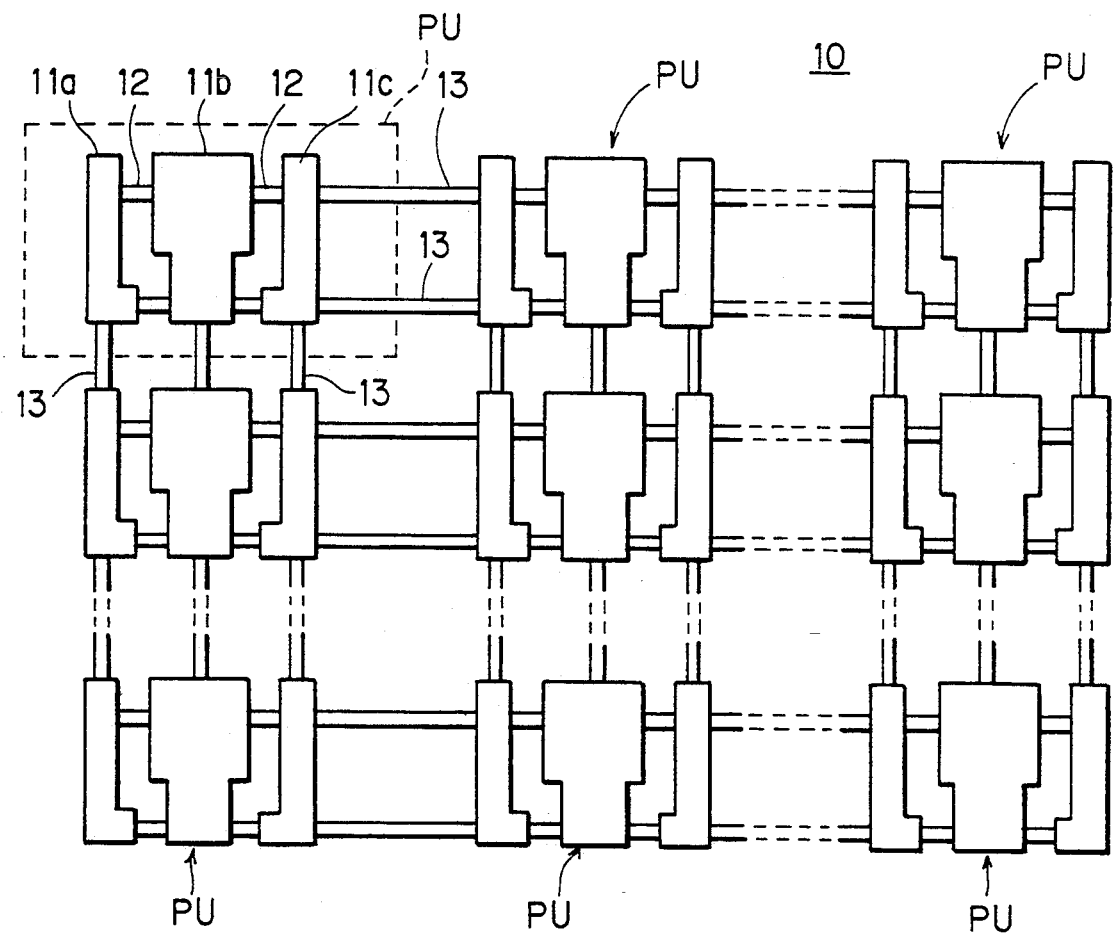

FIG. 2A is a plane view of the metal pattern plate 10. The metal pattern plate 10 includes pattern units PU in the form of a matrix arrangement. In this embodiment, the twenty five linked pattern units PU are in the matrix arrangement consisting of five rows and five columns. Each unit PU includes body portions 11a to 11c linked with each other by first linkages 12. The body portions 11a to 11c have shapes corresponding to parts of the circuit pattern to be formed on the insulation substrate. The units PU are linked to each other by second linkages 13. The body portions 11a to 11c have respective flat top surfaces aligned with each other and respective flat bottom surfaces also aligned with each other. The first and second linkage portions 12 and 13 have respective flat bottom portions aligned with the bottom surfaces of the body portions 11a to 1c.

Figure 3A:
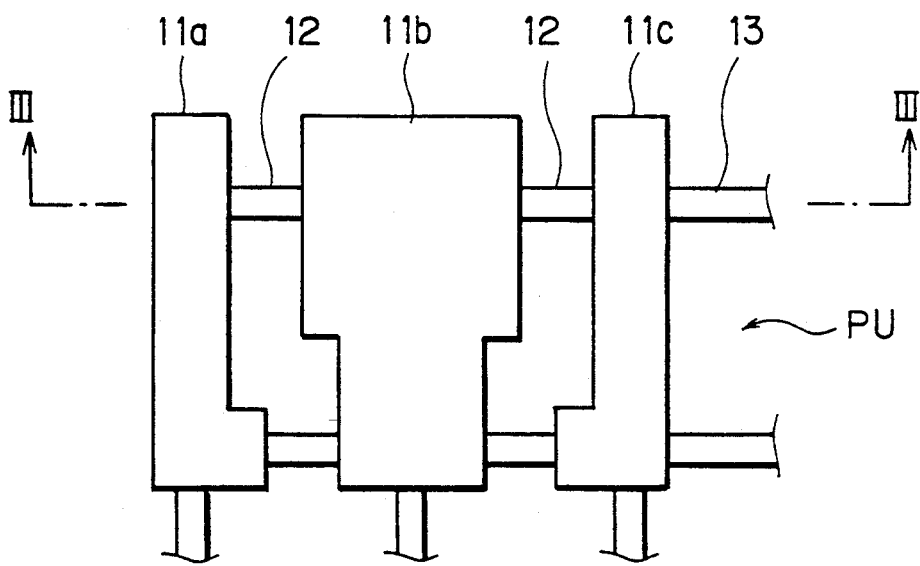
FIG. 3A is a plane view of pattern units.
Figure 3B:
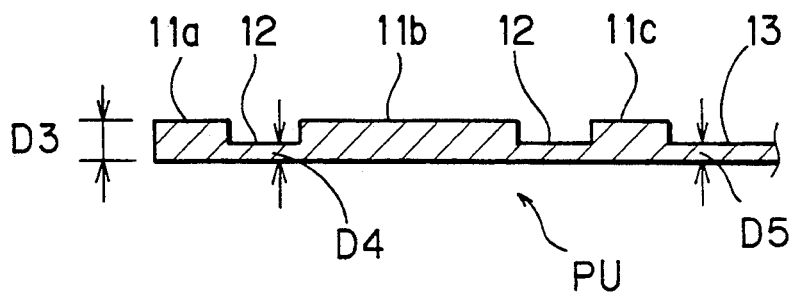
FIG. 3B is a cross sectional view of the pattern units taken along lines III—III of FIG. 3A.

FIG. 3A is an enlarged view of the unit PU enclosed in a dotted line in FIG. 2A. FIG. 3B is a cross sectional view of the unit PU taken along lines III—III of FIG. 3A. The body portions 11a to 11c are relatively thick. In this embodiment, the thickness D3 of the body portions 11a to 11c is about 1.0 to 2.0 mm. On the other hand, the first and the second linkages 12 and 13 are relatively thin, the thicknesses D4 and D5 thereof being equally around 0.3 to 0.5 mm in the preferred embodiment. The thickness D4 may be different from the thickness D5. The respective bottom surfaces of the body portions 11a to 11c and the linkages 12 and 13 are on the same plane to form a flat bottom plane, whereas the top surfaces of the linkages 12 and 13 are lower than the top surfaces of the body portions 11a to 11c.

Figure 2B:
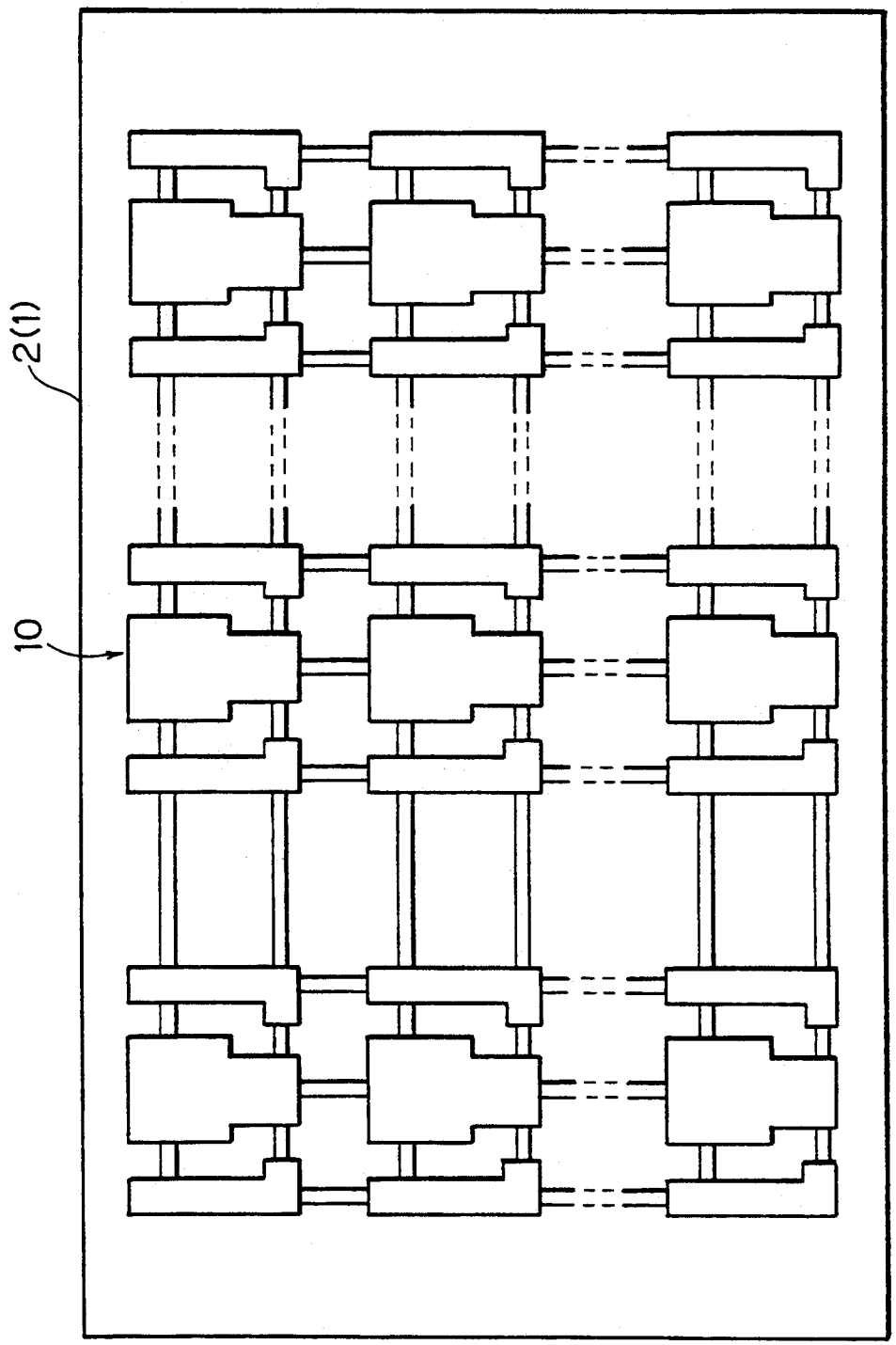

The combination of the body portions 11a to 11c and the linkages 12 and 13 is a monoplate. The metal pattern plate 10 of such a configuration is obtainable by preparing a copper plate which is provided with step portions through mechanical process and then punching rectangular holes and hook-shaped holes in the cupper plate. Thus, the body portions 11a to 11c and the linkages 12 and 13 can be sized with an enough high accuracy. The body portions 11a to 11c are spaced correspondingly to spacings between respective parts of the circuit pattern. The units PU shown in FIG. 2A are spaced from each other in accordance with the plane area size of each insulation substrate to be manufactured. FIG. 2B is a plane view of the structure corresponding to FIG. 1C in which the metal pattern plate 10 is fixed to the metal plate 1 through the insulation film 2.

After the step shown in FIG. 1C, the entire upper surface of the structure as above is coated with resist. By patterning the resist, a resist layer 3 (FIG. 1D) is formed which entirely covers the upper surface of the structure except the areas occupied by the linkages 12 and 13. The linkages 12 and 13 are then removed through etching in which the resist layer 3 is used as a mask. Thereafter, the resist layer 3 is removed. As a result, circuit patterns P each exclusively consisting of the body portions 11a to 11c are obtained as shown in FIG. 1E. Since the linkages 12 and 13 are relatively thin, the etching ends in a short period of time. Owing to this, the side portions of the body portions 11a to 11c would not be etched away seriously, and hence, there is no possibility that the body portions 11a to 11c will be formed with a largely degraded size accuracy.

FIG. 2C is a plane view of the structure of FIG. 1E. As shown in FIG. 2C, the circuit patterns P are formed on the insulation film 2, in the form of a matrix. As described earlier, the parts of the circuit pattern P correspond to the body portions 11a to 11c of the metal plate 10. For the sake of special identification, the descriptions hereinafter will use the symbols Pa, Pb and Pc to refer to the body portions 11a, 11b and 11c which have been separated from each other by etching.

Figure 2D:
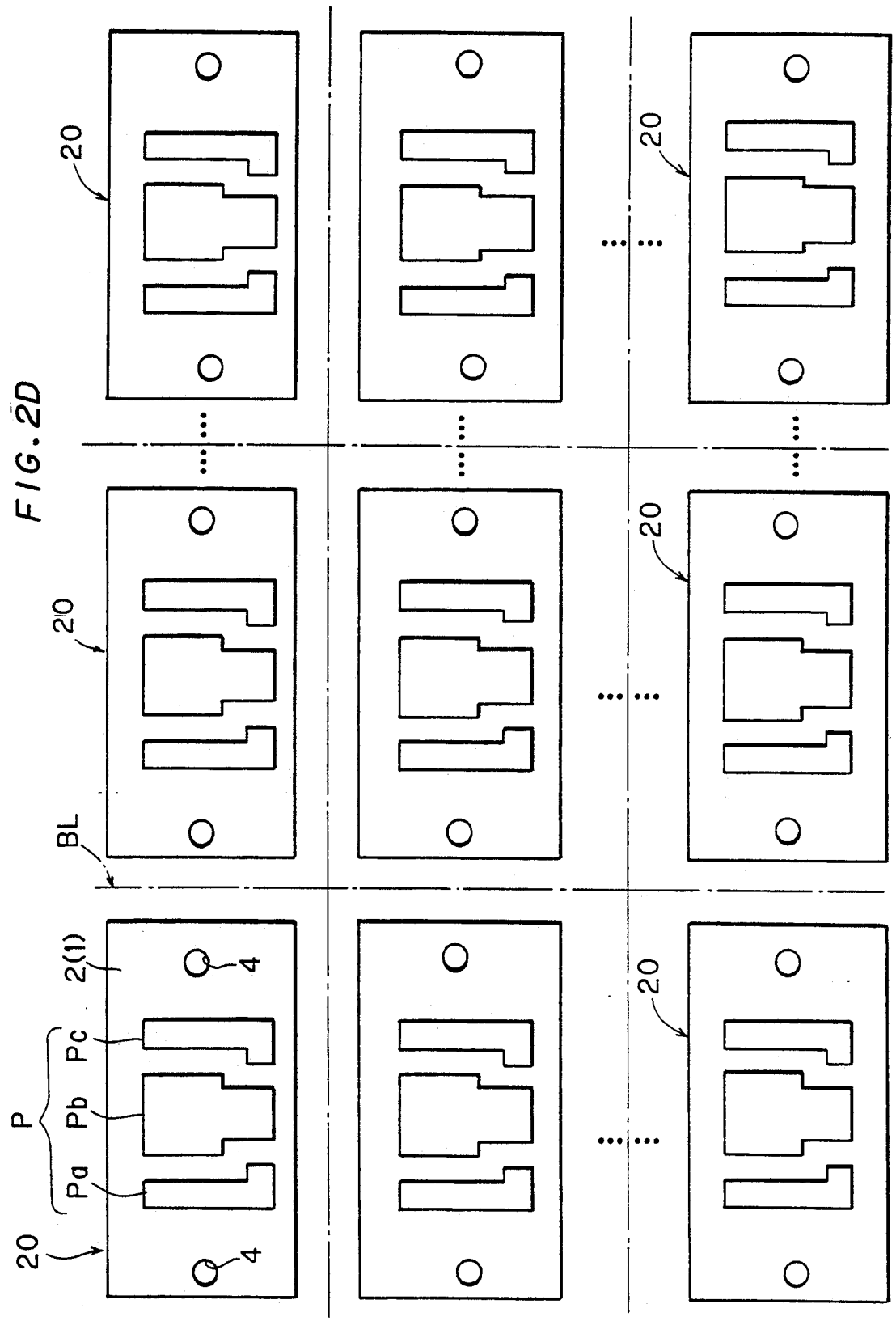
Figure 4:
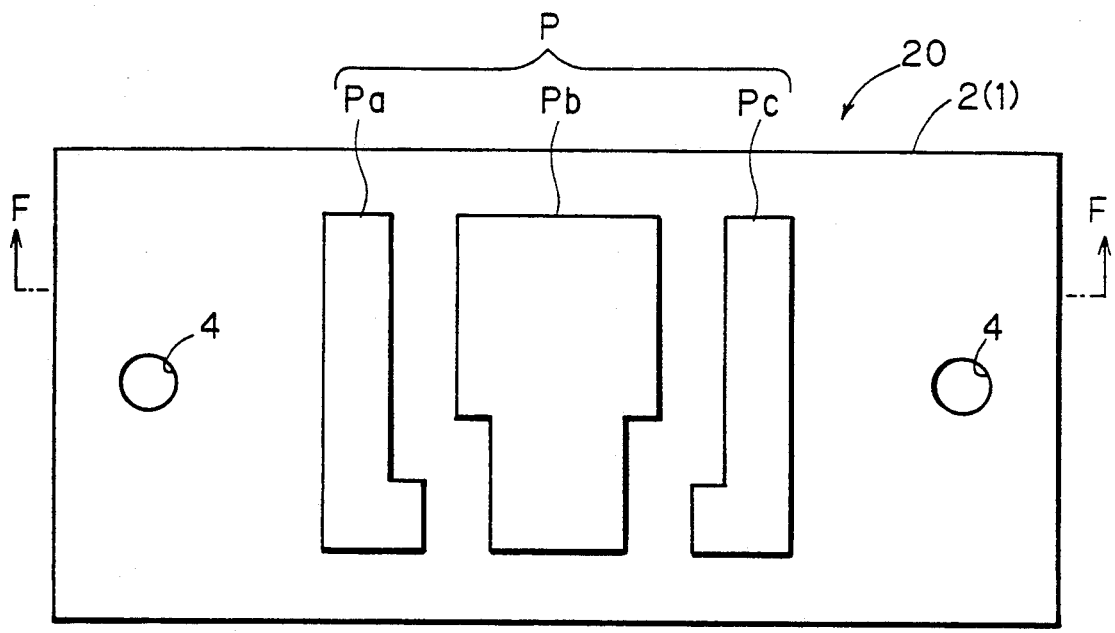
FIG. 4 is an enlarged plane view of the insulation substrate manufactured according to the preferred embodiment of the present invention.

In the next step (FIG. 1F), the structure in the state as shown in FIG. 1E is cut along the boundary lines BL between the pattern units PU into a plurality of unit structures, whereby a plurality of insulation substrates 20 are obtained. The lines BL also define the boundaries between the insulation substrates 20. In this embodiment, twenty five insulation substrates 20 are obtainable by cutting into five rows and five columns as shown in FIG. 2D. FIGS. 1F and 2D show the separated insulation substrates 20 as spaced from each other for convenience of illustration. The cutting may be performed by a dicing machine, for example. Simultaneously to the cutting, bolt holes 4 are formed which penetrate the insulation film 2 and the metal flat plate 1. The structure on the left side of the boundary line BL in FIG. 1F corresponds to a cross sectional view of the insulation substrate 20 of FIG. 4 (plane view) taken along lines F—F.

The manufacturing method as described above does not require means for adjusting spacings between the parts Pa to Pc of the circuit pattern P on the insulation film 2. This is because relative positioning of the parts Pa to Pc has already been done in the process of manufacturing the metal pattern plate 10. In addition, by aligning the metal pattern plate 10 to the metal flat plate 1 or the insulation film 2 before the cutting, positioning of the circuit patterns P on the insulation film 2 is automatically attained. As described earlier, the parts Pa to PC of the circuit patterns P are formed at a high accuracy.

Figure 5A:
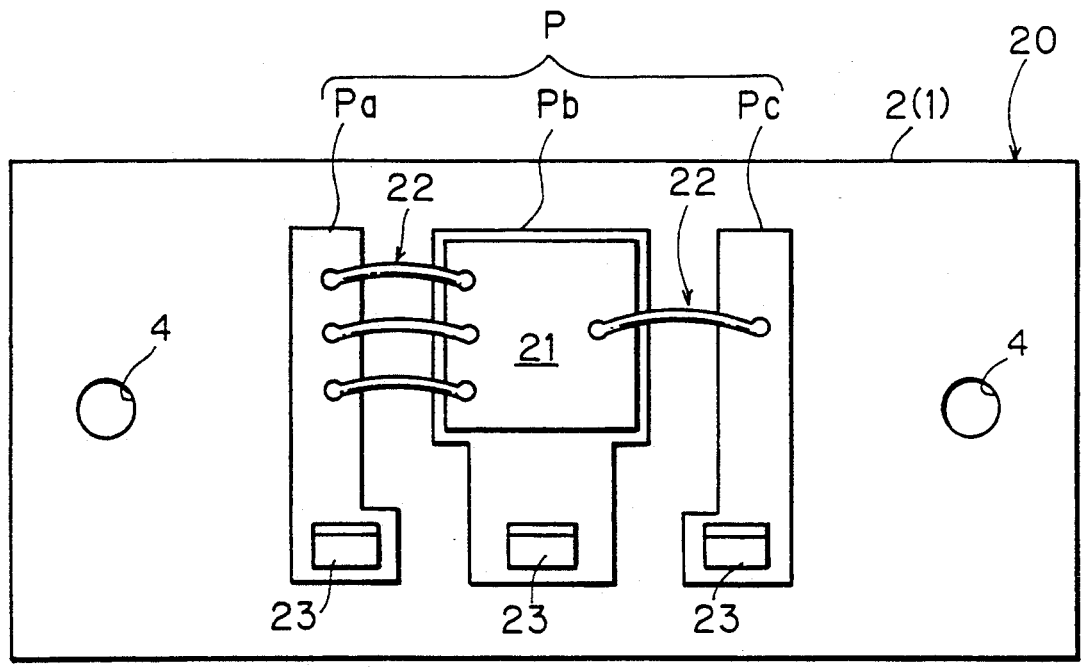
FIGS. 5A and 5B are a plane view and a front view, respectively, illustrating a method of manufacturing a semiconductor device employing the insulation substrate manufactured according to the preferred embodiment of the present invention.
Figure 5B:
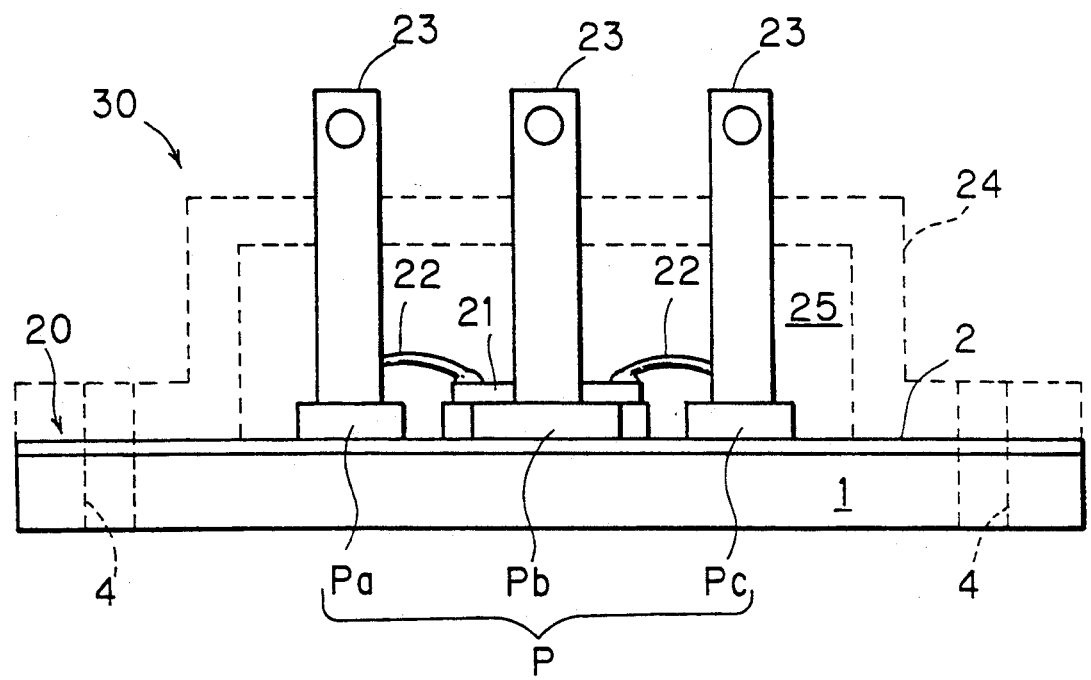

The insulation substrates 20 thus manufactured are utilized as follows. As shown in FIG. 5A as a plane view and FIG. 6B as a front view, a semiconductor chip 21 is soldered to the circuit pattern P on the part Pb which is in the center of the circuit pattern P. A wire bonding process is then conducted, whereby the semiconductor chip 21 is connected through aluminium wires 22 to the parts Pa and Pc located on the both sides of the center part Pb. Electrical connection between the center part Pb and the semiconductor chip 21 is attained without wires because the back surface of the semiconductor ship 21 is in electric contact to the center part Pb.

The parts Pa to Pc of the circuit pattern P are provided with external electrodes or faston electrodes erected thereon, each at edge portions. A casing 24 is mounted on the insulation substrate 20. An inner space 25 within the casing 24 is sealed with resin. Comprising the thick circuit pattern P, thus fabricated semiconductor device 30 is relatively small and withstands large electric power.

Now, other preferred embodiments of the present invention will be described.

Figure 6A:
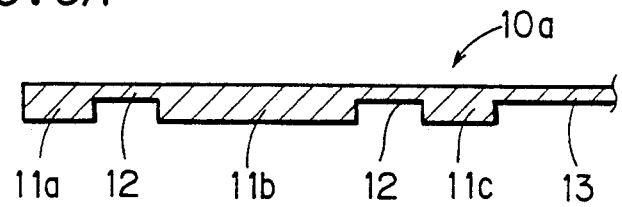
FIGS. 6A and 6B are cross sectional views illustrating other example of a metal pattern plate.
Figure 6B:
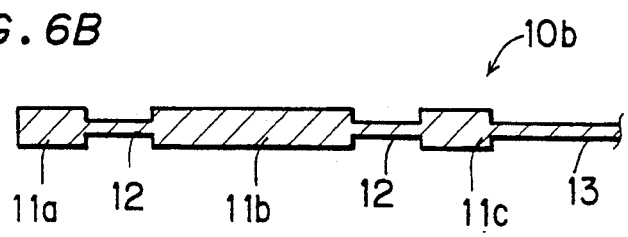

(1) In a metal pattern plate 10a shown in FIG. 6A, the upper surfaces of the body portions 11a to 11c and those of the linkages 12 and 13 are on the same plane, whereas the bottom surfaces of the body portions 11a to 11c are lower than those of the linkages 12 and 13. The linkages 12 and 13 do not contact the insulation film 2 when the metal pattern plate 10a is affixed to the insulation film 2. Hence, the linkages 12 and 13 may be removed by using a machine cutter as well as etching. Besides, a metal pattern plate 10b as shown in FIG. 6B may be used which includes the linkages 12 and 13 located in a middle height of the length of the body portions 11a to 11c. A machine cutter may be also used for cutting the linkages 12 and 13 in the metal pattern plate 10b.

(2) The linkages 12 and 13 may be linear bridges as shown in FIG. 3A, or may be relatively wide strips. As far as the metal pattern plate 10 does not easily deform when handled, it is preferable that the linkages 12 and 13 are as thin and narrow as possible.

Figure 7A:
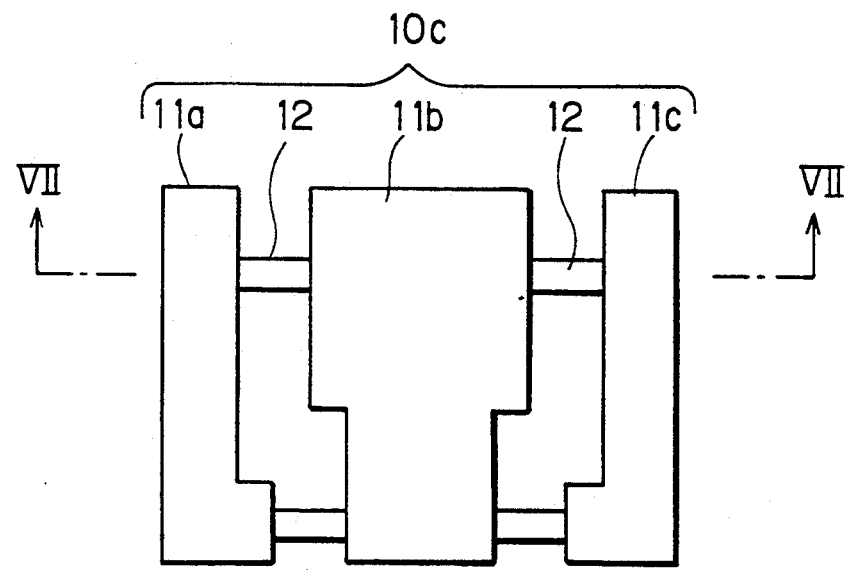
FIG. 7A is a plane view of a metal pattern plate used for separately manufacturing insulation substrates.
Figure 7B:
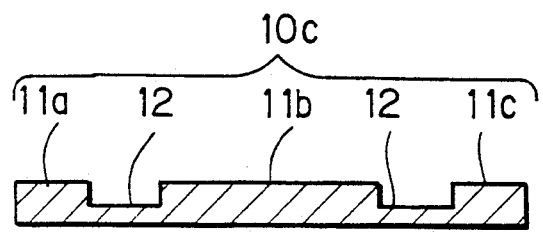
FIGS. 7B is a cross sectional view of the metal pattern plate taken along lines VII—VII of FIG. 8A.

(3) FIG. 7A is a plane view of a metal pattern plate 10c which is used to manufacture insulation substrates individually. FIG. 7B is a cross sectional view of the metal pattern plate 10c taken along lines VII—VII of FIG. 7A. The metal pattern plate 10c includes relatively thick body portions 11a to 11c and relatively thin linkages 12, the body portions 11a to 11c and the linkages 12 being a monoplate. The metal pattern plate 10c may be obtained by preparing a metallic plate having steps thereon and punching holes. In using the metal pattern plate 10c, a metal plate with a plane area size equal to that of an insulation substrate is previously prepared. The metal pattern plate 10c is fixed to the metal plate through an insulation film. The metal pattern plate 10c are thereafter selectively etched to remove the linkages 12, similarly to the insulation substrate 20 described above.

Figure 8A:
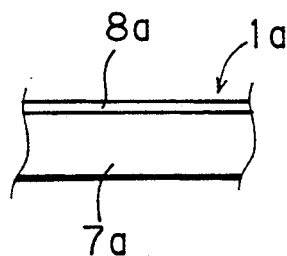
FIGS. 8A and 8B are cross sectional views of other example of a metal plate.
Figure 8B:
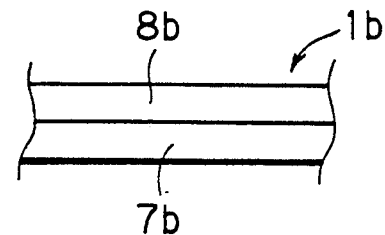
Figure 9A:
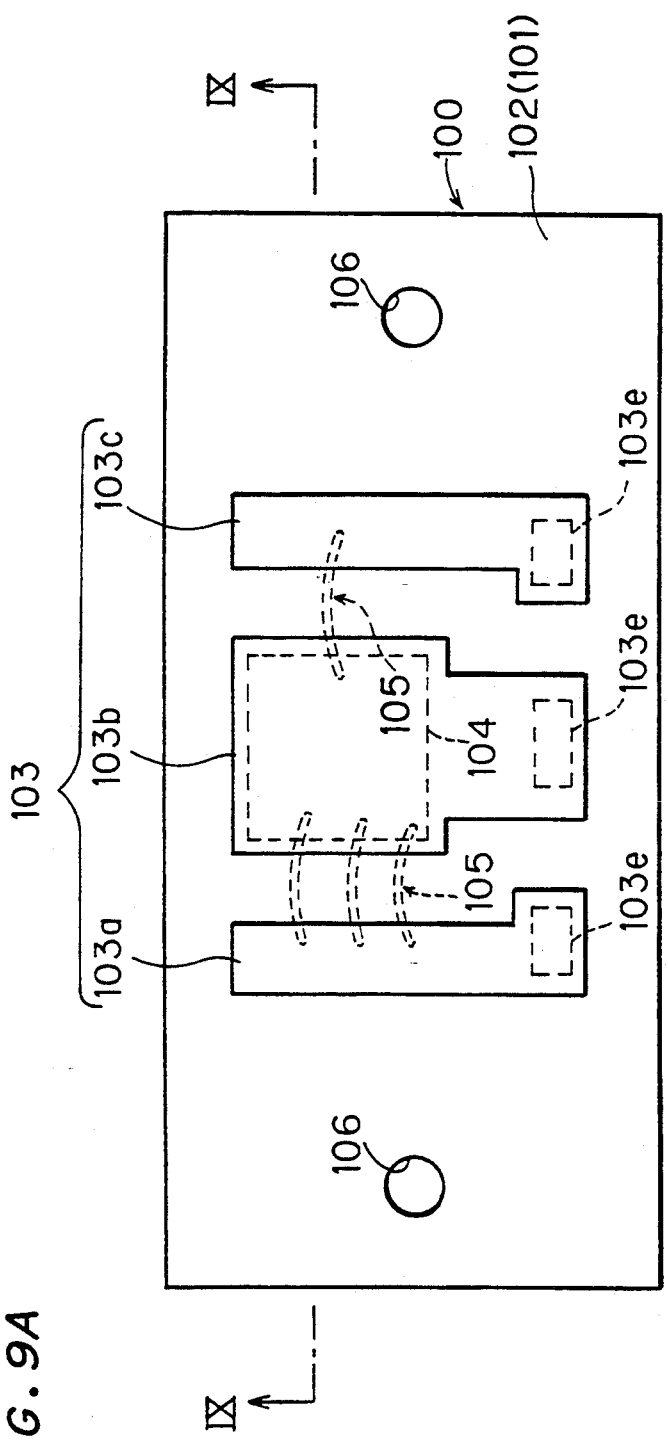
FIG. 9A is a plane view of a conventional insulation substrate.
Figure 9B:
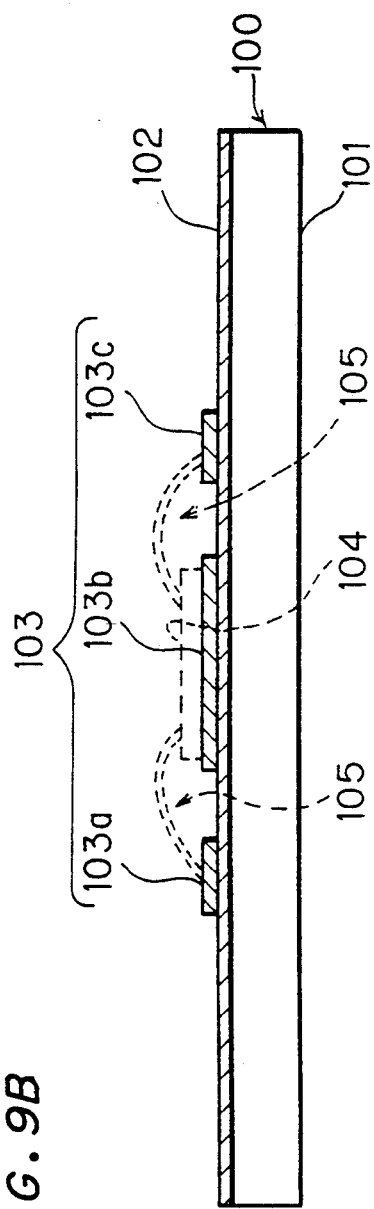
FIG. 9B is a cross sectional view of the conventional insulation substrate taken along lines IX—IX of FIG. 1A.

(4) The metal pattern plates 10 and 10a to 10c may be metal, e.g., aluminum, other than cupper. A laminated or layered metal may be employed as the metal pattern plate. Likewise, the metal flat plate I may be other than aluminum. For instance, the metal flat plate may be a metal flat plate 1a which is formed by a copper plate 7a overlaid with a nickel plating layer 8a (FIG. 8A), or may be a layered metal plate called as a hit substrate, comprised of a copper layer 7b and an aluminum 8b (FIG. 8B). The metal flat plate 1 and the metal pattern plates 10 and 10a to 10c may be alloys.

(5) The resist layer 3 is not indispensable for removing the linkages 12 and 13 by etching. Owing to relatively thin thicknesses, the linkages 12 and 13 can be completely etched away in a relatively short period of time. Hence, most parts of the body portions 11a to 11c would remain even if eroded by an etchant during etching. Unless considerably rugged surfaces of the body portions 11a to 11c result because of the etching, the resist layer 3 may be omitted.

(6) The present invention is not exclusively directed to an insulation substrate for mounting a single semiconductor chip, but is also applicable to an insulation substrate for mounting a plurality of semiconductor chips and one or more passive elements. In this regard, the present invention uses the term "semiconductor device" in a broad sense. "Semiconductor device" broadly refers to an apparatus incorporating various electronic elements including a semiconductor chip and electrical machineries. Although the present invention is suitable especially for an insulation substrate for a semiconductor device to be used with large electric power, applications to other devices remain open.

While the invention has been shown and described in detail, the foregoing description is in all aspects illustrative and not restrictive. It is understood that numerous other modifications and variations can be devised without departing from the scope of the invention.

We claim:

1. A metal pattern plate used in manufacturing an insulation substrate for a semiconductor device, wherein said insulation substrate comprises a metal plate, an insulation layer provided on said metal plate and a conductive circuit pattern formed on said insulation layer, said metal pattern plate comprising:
   (a) a plurality of body portions, two-dimensionally arranged with gaps therebetween, having a first thickness and having shapes corresponding to respective portions of said circuit pattern; and
   (b) linkage portions having a second thickness, provided in said gaps between said plurality of body portions, and linking said plurality of body portions to each other;
   wherein said second thickness is less than said first thickness; and
   said plurality of body portions and said linkage portions are made of a same metal and form a single unitary plate.

2. The metal pattern plate of claim 1, wherein said plurality of body portions are spaced from each other in accordance with spaces between respective parts of said circuit pattern.

3. The metal pattern plate of claim 2, wherein said plurality of body portions have:
   respective flat top surfaces aligned with each other; and
   respective flat bottom surfaces aligned with each other.

4. The metal pattern plate of claim 3, wherein said first and second linkage portions have:
   respective flat bottom surfaces aligned with said flat bottom surfaces of said plurality of body portions.

5. The metal pattern plate of claim 3, wherein said first and second linkage portions have:
   respective flat top surfaces aligned with said flat top surfaces of said plurality of body portions.

6. The metal pattern plate of claim 3, wherein said first and second linkage portions have:
   respective flat top surfaces lower than said flat top surfaces of said plurality of body portions: and
   respective flat bottom surfaces higher than said flat bottom surfaces of said plurality of body portions.

7. A metal pattern plate used in manufacturing an insulation substrate for a semiconductor device, wherein said insulation substrate comprises a metal plate, an insulation layer provided on said metal plate and a conductive circuit pattern formed on said insulation layer, said metal pattern plate comprising:
   (a) a plurality of unit pattern parts, two-dimensionally arranged with first gaps therebetween, each comprising:
      (a-1) a plurality of body portions having a first thickness, two-dimensionally arranged with second gaps therebetween, and having shapes corresponding to respective portions of said circuit pattern; and
      (a-2) first linkage portions having a second thickness provided in said second gaps between said plurality of body portions, and linking said plurality of body portions to each other; and
   (b) second linkage portions having a third thickness provided in said first gaps between said plurality of unit pattern parts, and linking said plurality of unit pattern parts to each other;
   wherein said second and third thickness are less than said first thickness; and
   said plurality of body portions and said first and second linkage portions are made of a same metal and form a single unitary plate.

8. The metal pattern plate of claim 7, wherein said plurality of body portions are spaced from each other in accordance with spaces between respective parts of said circuit pattern.

9. The metal pattern plate of claim 8, wherein said second thickness is equal to said third thickness.

10. The metal pattern plate of claim 9, wherein said plurality of unit pattern parts are arranged into a matrix.

11. The metal pattern plate of claim 10, wherein said plurality of body portions have:
    respective flat top surfaces aligned with each other; and
    respective flat bottom surfaces aligned with each other.

12. The metal pattern plate of claim 10, wherein said first and second linkage portions have:
    respective flat bottom surfaces aligned with said flat bottom surfaces of said plurality of body portions.

13. The metal pattern plate of claim 10, wherein said first and second linkage portions have:
    respective flat top surfaces aligned with said flat top surfaces of said plurality of body portions.

14. The metal pattern plate of claim 10, wherein said first and second linkage portions have:
    respective flat top surfaces lower than said flat top surfaces of said plurality of body portions: and
    respective flat bottom surfaces higher than said flat bottom surfaces of said plurality of body portions.

15. The metal pattern plate of claim 1, wherein the ratio of the second thickness to the first thickness is less than 0.5.

16. The metal pattern plate of claim 15, wherein the ratio of the second thickness to the first thickness is greater than 0.3.

17. The metal pattern plate of claim 1, wherein the first thickness is between 1.0 and 2.0 $\mu$m and the second thickness is between 0.3 and 0.5 $\mu$m.

18. The metal pattern plate of claim 7, wherein the second thickness is equal to the third thickness, and the ratio of the second and third thickness to the first thickness is less than 0.5.

19. The metal pattern plate of claim 18, wherein the ratio of the second and third thickness to the first thickness is greater than 0.3.

20. The metal pattern plate of claim 7, wherein the first thickness is between 1.0 and 2.0 $\mu$m and the second thickness is equal to the third thickness and is between 0.3 and 0.5 $\mu$m.

* * * * *